(12) United States Patent
Marcinek

(10) Patent No.: US 8,643,504 B2
(45) Date of Patent: Feb. 4, 2014

(54) POWER DISTRIBUTION UNIT

(76) Inventor: Gregory J. Marcinek, Upton, MA (US)

( * ) Notice: Subject to any disclaimer, the term of this patent is extended or adjusted under 35 U.S.C. 154(b) by 758 days.

(21) Appl. No.: 12/794,747

(22) Filed: Jun. 6, 2010

(65) Prior Publication Data

US 2011/0095901 A1    Apr. 28, 2011

Related U.S. Application Data

(60) Provisional application No. 61/184,821, filed on Jun. 7, 2009.

(51) Int. Cl.
*G08B 5/00*    (2006.01)

(52) U.S. Cl.
USPC ........................................ 340/815.4; 439/214

(58) Field of Classification Search
USPC .......... 361/733, 826, 600, 688; 439/532, 214; 307/70; 340/815.4
See application file for complete search history.

(56) References Cited

U.S. PATENT DOCUMENTS

| | | | |
|---|---|---|---|
| 5,821,636 A * | 10/1998 | Baker et al. ...................... | 307/70 |
| 6,175,503 B1 * | 1/2001 | Hogan et al. ................. | 361/733 |
| 6,867,966 B2 | 3/2005 | Smith et al. | |
| 6,937,461 B1 | 8/2005 | Donahue | |
| 7,252,524 B1 | 8/2007 | Johnson | |
| 7,561,411 B2 * | 7/2009 | Johnson, Jr. .................. | 361/600 |
| 7,619,868 B2 | 11/2009 | Spitaels | |
| 2005/0170678 A1 * | 8/2005 | Donahue ...................... | 439/214 |
| 2005/0259383 A1 | 11/2005 | Ewing | |
| 2006/0116023 A1 * | 6/2006 | Spitaels et al. ................ | 439/532 |
| 2007/0217178 A1 * | 9/2007 | Johnson et al. ............... | 361/826 |
| 2009/0097200 A1 * | 4/2009 | Sharma et al. ................ | 361/688 |

FOREIGN PATENT DOCUMENTS

| | | |
|---|---|---|
| KR | 20-0228239 | 6/2001 |
| KR | 20-0440143 | 5/2008 |

OTHER PUBLICATIONS

Written Opinion for International (PCT) Patent Application No. PCT/US2011/021438, mailed Oct. 28, 2011.

* cited by examiner

*Primary Examiner* — Steven Lim
*Assistant Examiner* — Kaleria Knox
(74) *Attorney, Agent, or Firm* — Daniel N. Beinart; Andover Patents, LLC

(57) ABSTRACT

A power distribution device includes a chassis, a power input, and power brick bays for receiving, and delivering power to, power bricks. Each power brick bay includes a power adapter for providing power to a power brick.

20 Claims, 13 Drawing Sheets

POWER DISTRIBUTION UNIT

CROSS-REFERENCE TO RELATED APPLICATIONS

This application claims priority to U.S. Provisional Application No. 61/184,821 filed Jun. 7, 2009, the entire contents of which are hereby incorporated by reference, as if fully set forth herein.

FIELD OF THE INVENTION

The present invention relates generally to the field of power distribution units, and more particularly to a power distribution unit that provides receptacles for power modules.

BACKGROUND OF THE INVENTION

Existing power distribution units (PDU) have various deficiencies, including the difficulty of managing the physical configuration of the power modules or bricks that are provided power by a PDU. Existing PDUs do not provide a means for physically securing the power bricks receiving power from the PDU, thus a power brick may easily be accidentally dislodged from its connection to the PDU while performing work activities in the vicinity of the PDU. For example, the AVAYA IP Office IP400 product utilizes multiple control units and external expansion modules, each with its own external power supply unit, also known as a power brick (e.g., an AC to DC converter such as a Power Solve PSG60-24-04). When these power bricks are plugged into an existing PDU, the power cords attached to the power bricks typically are disorganized and tangled, which can easily lead to accidental disconnection of the IP Office power or other equipment on the rack not related to the IP Office (e.g., routers and switches for a data network).

Therefore a need exists for a PDU that allows for easy management of the power bricks, and that reduces the likelihood of accidentally or inadvertently dislodging a connected power brick.

A device constructed according to the principles of the present invention addresses these deficiencies.

BRIEF SUMMARY OF THE INVENTION

In accordance with principles of the present invention, one embodiment of a power distribution unit includes a chassis, a power input for receiving power from an external power source, a plurality of power brick bays for receiving, and delivering power to, respective power bricks, where each power brick bay includes a power adapter for providing power to a power brick, and electrical wiring for distributing power from the power input to the plurality of power brick bays.

Other objects and features of the present invention will become apparent from the detailed description considered in connection with the accompanied drawings. It is to be understood however, that the drawings are designed as an illustration only and not as definition of the limits of the invention. It is obvious that many changes and modifications may be made thereunto without departing from the spirit and scope of the invention.

DETAILED DESCRIPTION OF THE INVENTION

Figure 1:
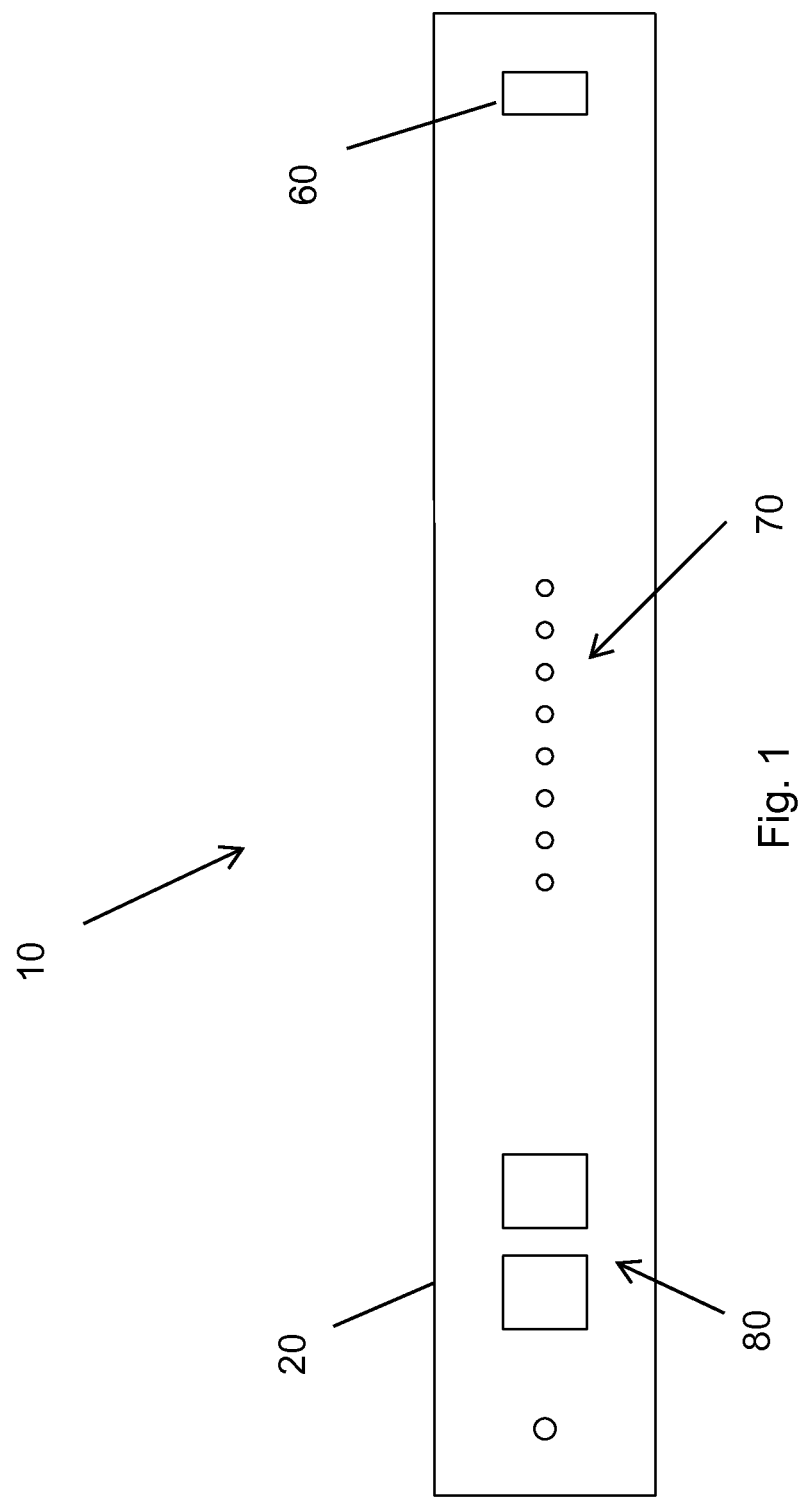
FIG. 1 depicts a front view of an embodiment of a power distribution unit in accordance with principles of the present invention.
Figure 2:
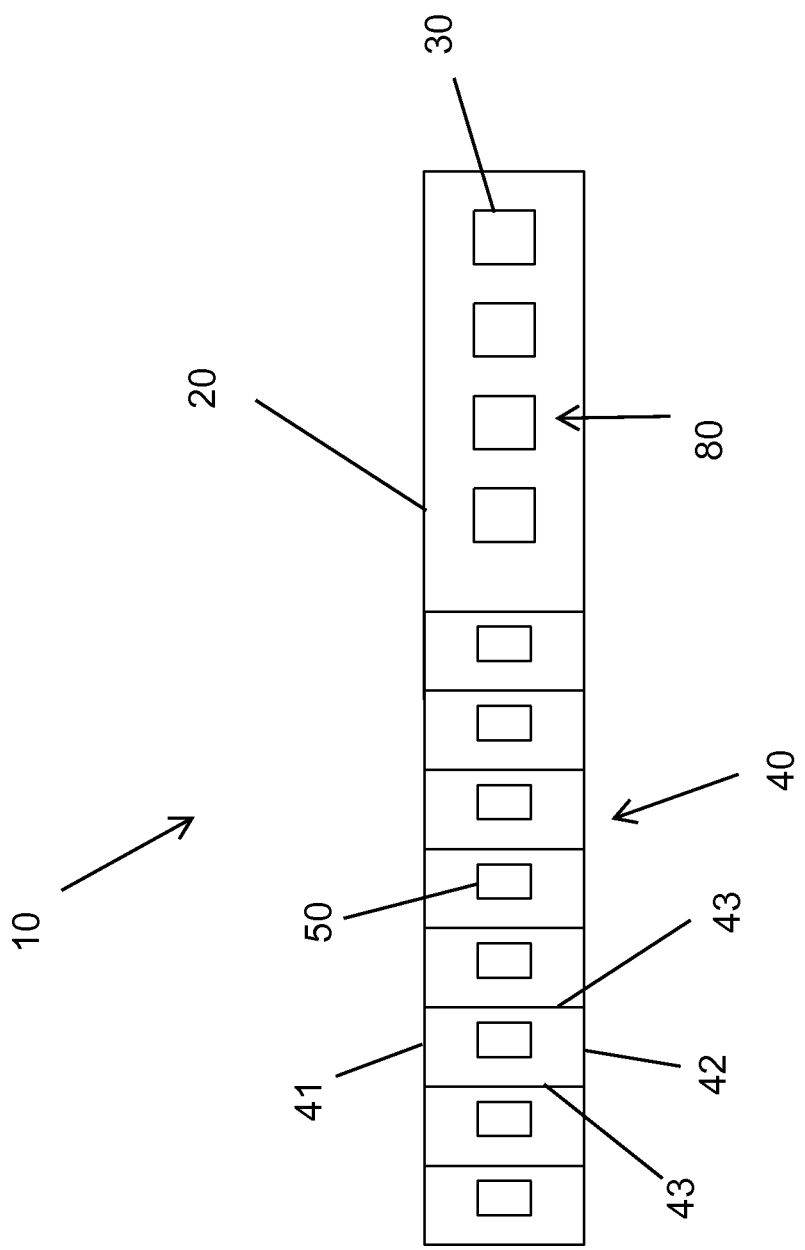
FIG. 2 depicts a rear view of an embodiment of a power distribution unit in accordance with principles of the present invention.
Figure 3:
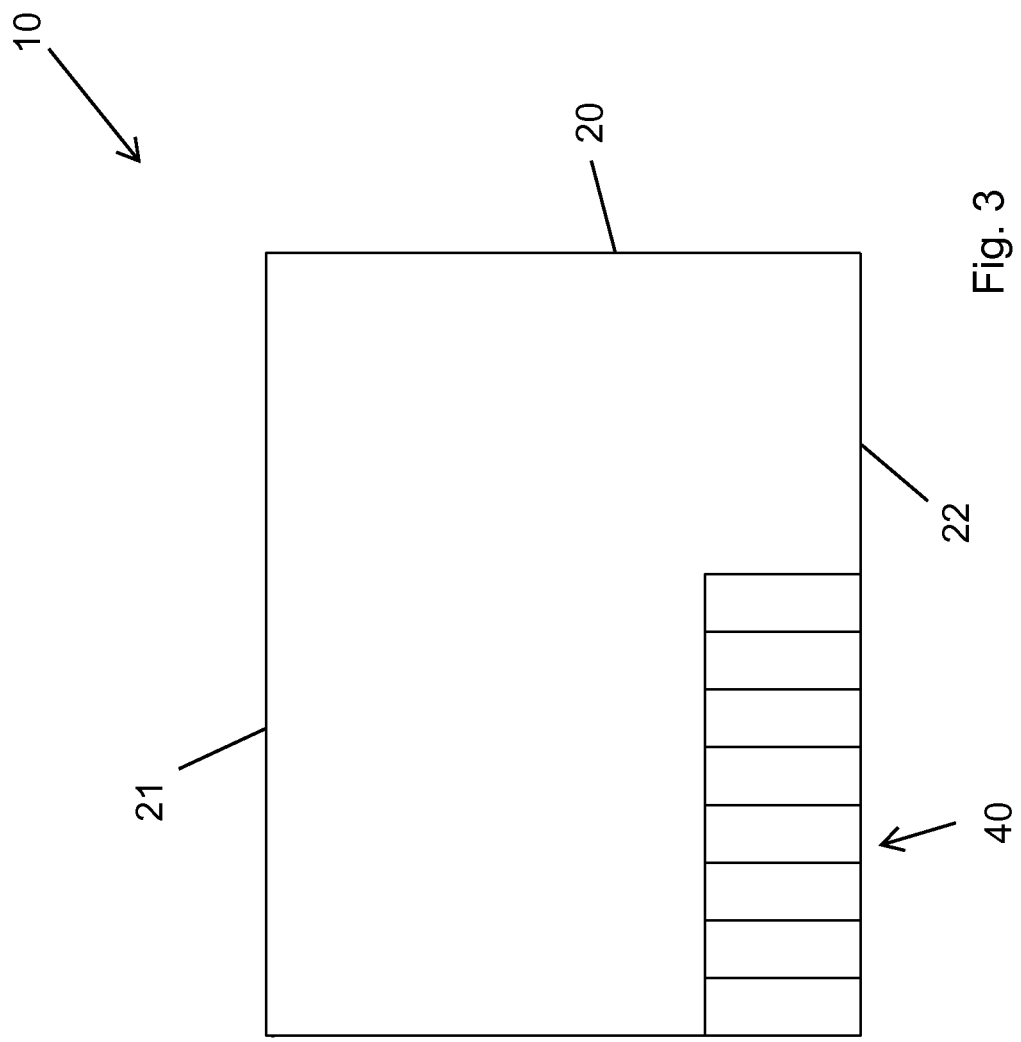
FIG. 3 depicts a top view of an embodiment of a power distribution unit in accordance with principles of the present invention.

FIGS. 1-13 depict an embodiment of a power distribution unit (PDU), also called a power distribution device, in accordance with principles of the present invention. A PDU 10 comprises a chassis 20, a power input 30 for receiving power from an external power source, electrical wiring (FIG. 7) for distributing power to some or all of the components of the PDU 10, and one or more power brick bays 40 for receiving respective power bricks, where each power brick bay 40 includes a female power adapter 50 for providing power to a power brick. As depicted in FIGS. 2-4, 6, 8, 9 12 and 13, the one or more power brick bays 40 are located at the rear of the chassis 20 and are arranged substantially along a line between the two opposing left and right sides of the chassis 20. FIG. 3 depicts a PDU with its top cover 23 removed, so as to show the placement of the power brick bays 40. However, one skilled in the art will recognize that in alternative embodiments of the PDU 10, some or all of the power brick bays 40 may alternatively be located at other positions on the chassis 20 (e.g., front, rear, top, bottom, or side). For example, an alternate embodiment of a PDU 10 depicted in FIGS. 8 and 9 includes six power brick bays 40 located along the rear of the chassis 20 and a seventh power brick bay 40 located along the side of the chassis 20.

Typically, a power adapter 50 will provide AC power, however, one skilled in the art will recognize that an alternative embodiment of a PDU 10 may include one or more power adapters 50 that provide DC power.

Figure 11:
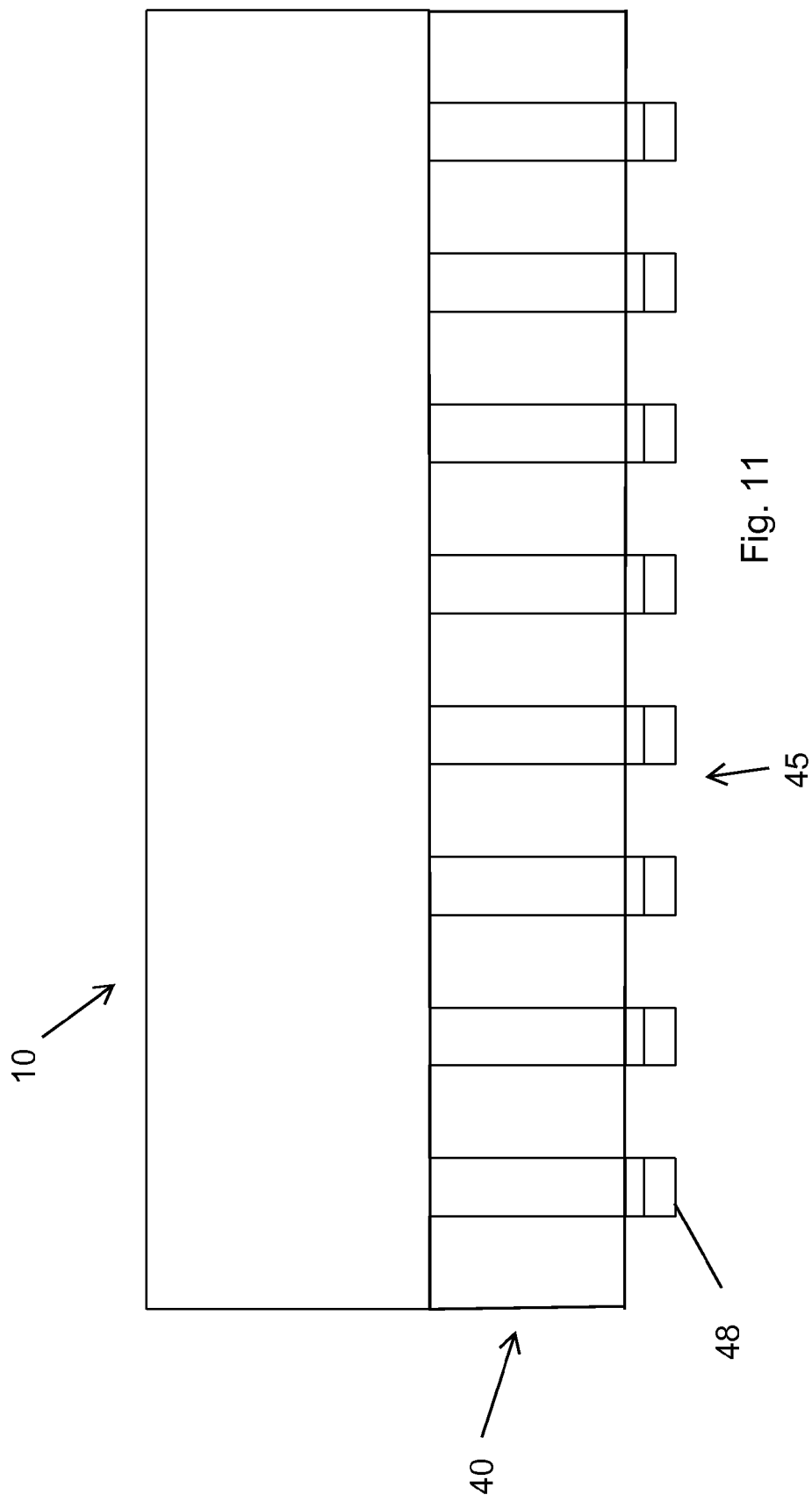
FIG. 11 depicts an alternate embodiment of a power distribution unit that includes latches in accordance with principles of the present invention.
Figure 12:
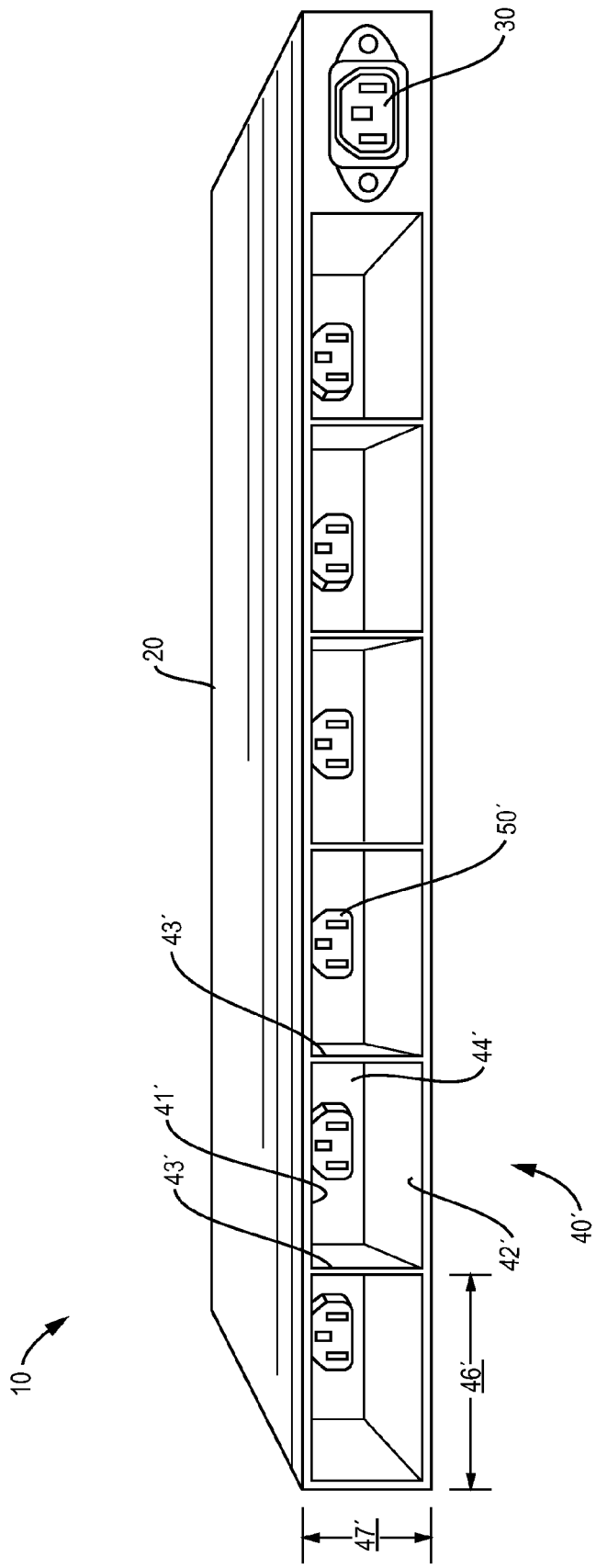
FIGS. 12 and 13 depict rear perspective views of an embodiment of a power distribution unit in accordance with principles of the present invention.

One skilled in the art will also recognize that in alternative embodiments of the PDU 10, some or all of the power adapters 50 may be of a male, as opposed to female, gender. Furthermore, one skilled in the art will understand that while FIGS. 2-4, 6, 11 and 13 depict eight power brick bays 40, a lesser or greater number of power brick bays 40 may be used, and the orientation of each power brick bay 40 relative to the chassis 20 may differ from the orientation depicted in FIGS. 2, 6 and 13. FIG. 12 depicts a PDU 10 with six power brick bays 40' with horizontal orientations (as opposed to the sideways orientations depicted in FIG. 6) relative to chassis 20.

Figure 6:
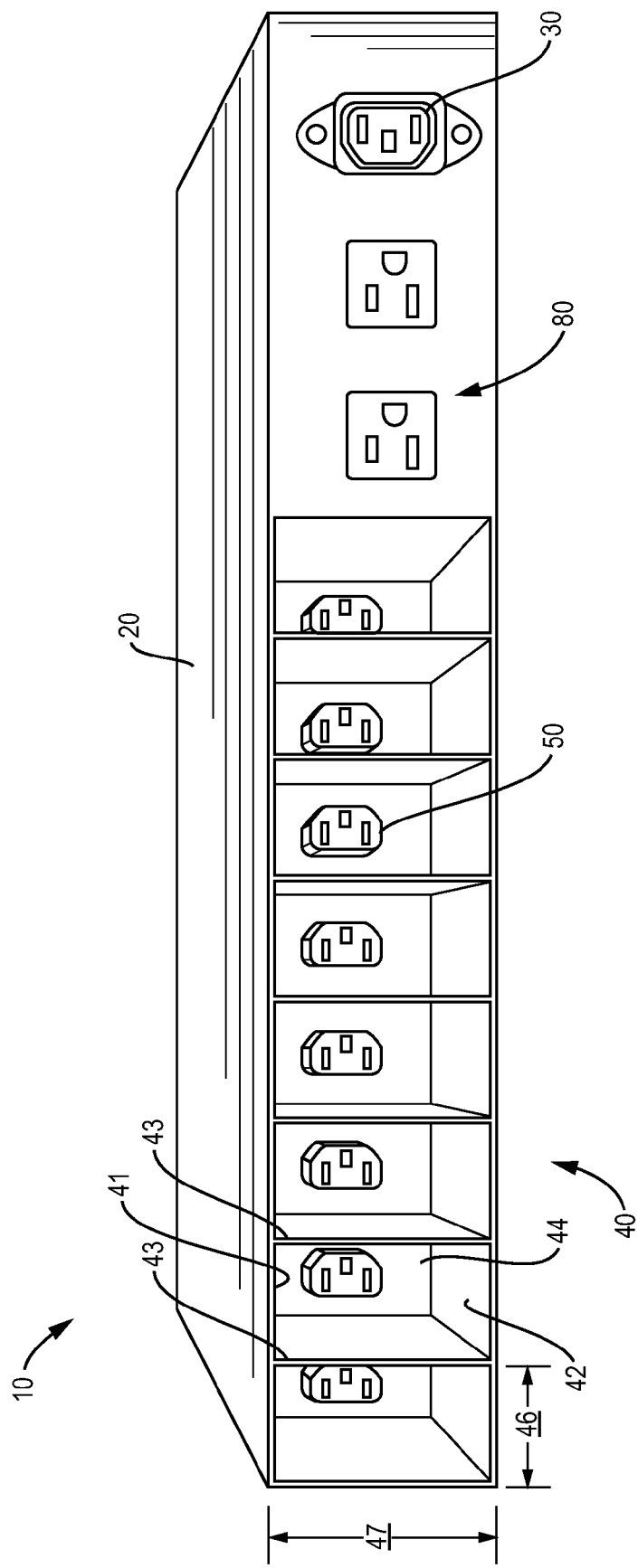

As depicted in FIG. 6 and FIG. 12, each power brick bay 40 (40') is comprised of a top wall 41 (41'), bottom wall 42 (42'), opposing the top wall 41 (41'), two opposing side walls 43 (43'), and a rear wall 44 (44') arranged in a substantially rectangular configuration. Each female power adapter 50 (50') is located at the rear wall 44 (44') of a power brick bay 40 (40'), and positioned so as to pluggably mate with a corresponding male power connector of a power brick (not shown) when the power brick is inserted in the power brick bay 40 (40').

As depicted in FIG. 6, the top wall 41 and bottom wall 42 each have substantially equal first width 46; similarly, the opposing side walls each have substantially equal second width 47. The first width 46 is less than the second width 47, thereby permitting a power brick bay 40 to receive a power brick in a sideways orientation.

In FIG. 12, the top wall 41' and bottom wall 42' each have substantially equal first width 46'; similarly, the opposing side walls each have substantially equal second width 47'. The first width 46' is greater than the second width 47', thereby permitting a power brick bay 40' to receive a power brick in a horizontal orientation.

Figure 13:
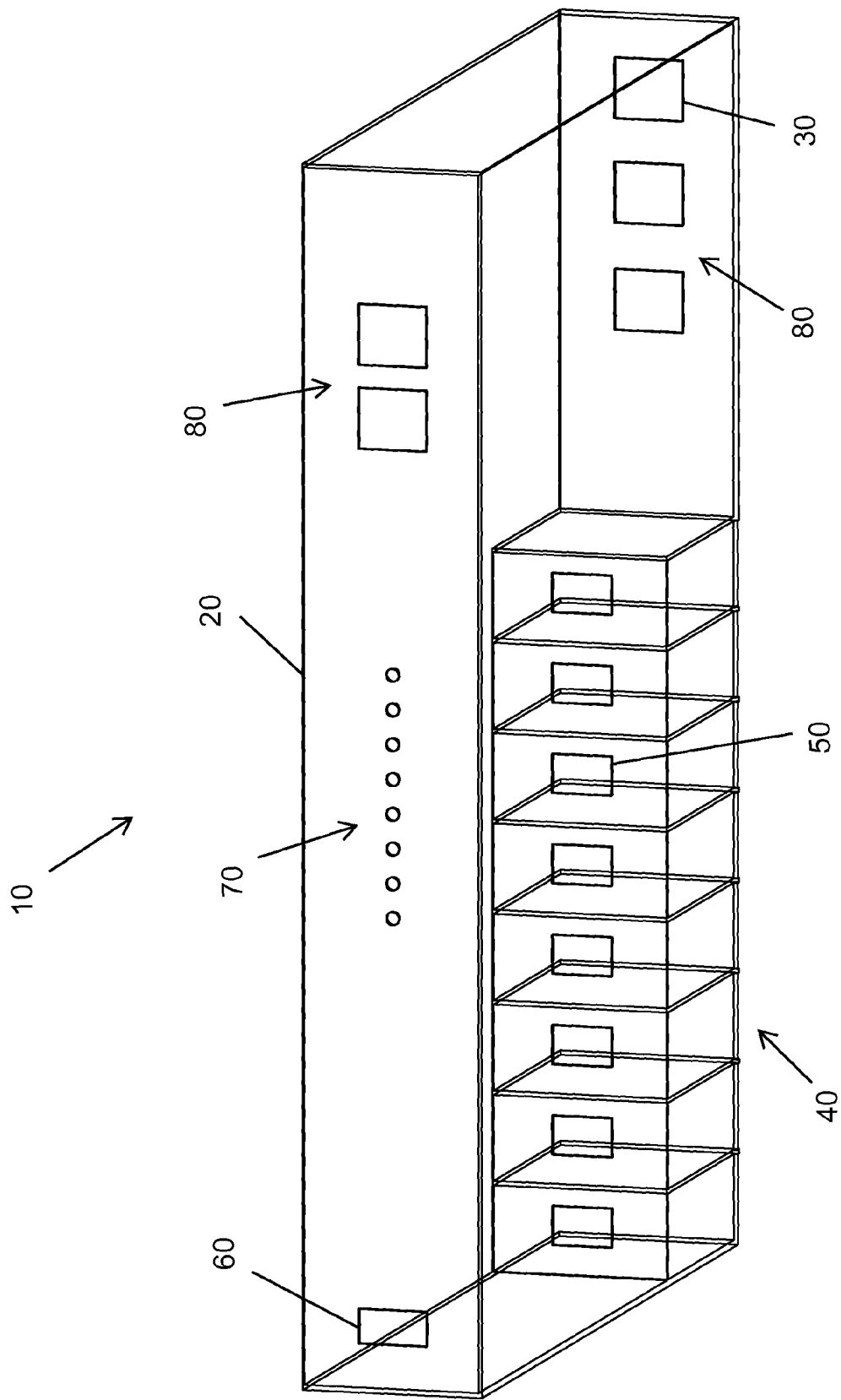

An alternate embodiment of a PDU 10 has open power brick bays 40, each power brick bay 40 not having a top wall 41, as depicted in FIG. 13.

Optionally, a PDU 10 may further comprise a power switch 60, which may be lighted or not, one or more LED power indicators 70, one or more AC power outlets or adapters 80 (e.g., NEMA 5-15) located on the front panel 21 and/or rear panel 22 of the chassis 20.

The power input 30 and/or the one or more female power adapters 50 may be IEC 320 C13 connectors that are compatible with the IEC (International Electrotechnical Commission, Geneva, Switzerland) 60320 "Appliance couplers for household and similar general purposes" specification. However, one skilled in the art will understand that other types of power inputs and power adapters may be utilized as well in a PDU.

A PDU 10 may be optionally mountable in an equipment rack (not shown) compatible with common equipment rack specifications such as 19" or 23" (IEC 60297 "Mechanical structures for electronic equipment"). This may be accomplished, e.g., by the addition of rack mount brackets (not shown) that are attached to or incorporated into the PDU.

Figure 4:
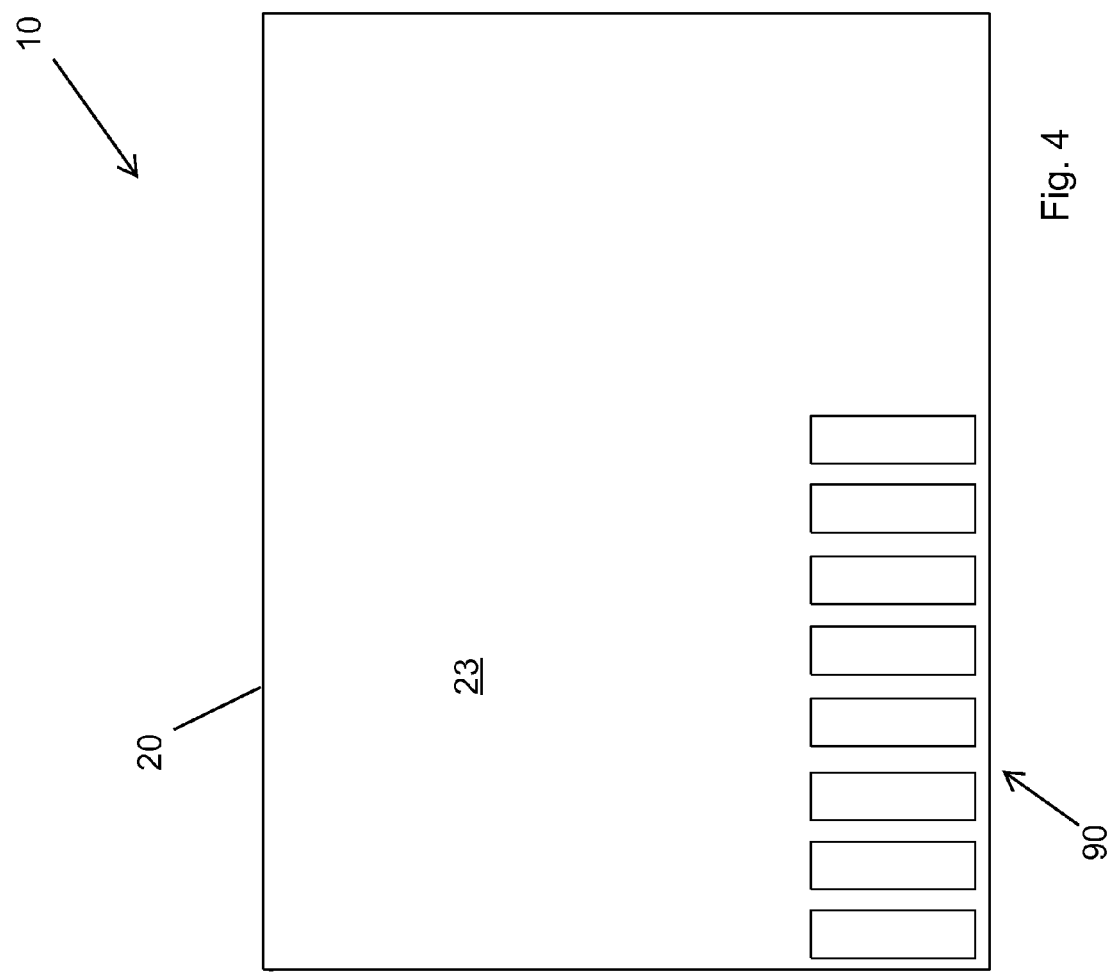
FIG. 4 depicts a top view of an alternate embodiment of a power distribution unit with slots for heat dissipation.
Figure 5:
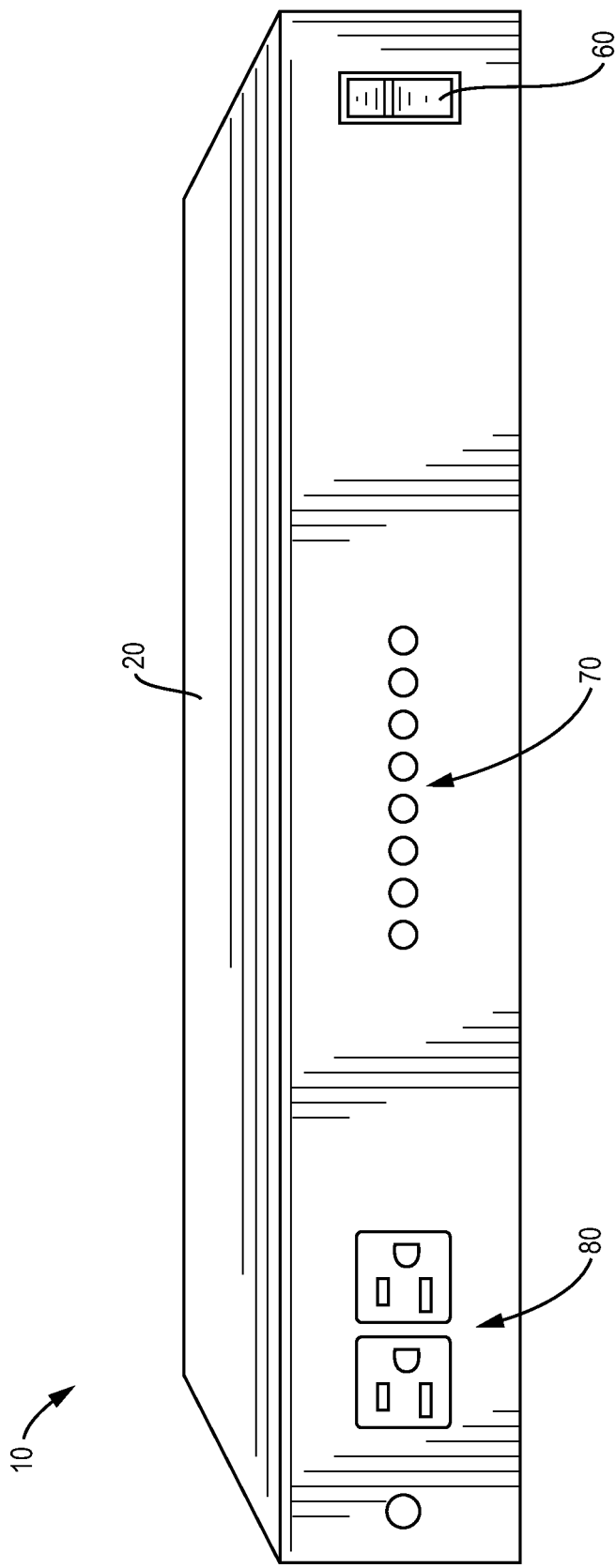
FIGS. 5 and 6 depict perspective views of an embodiment of a power distribution unit in accordance with principles of the present invention.

In addition, as shown in FIG. 4, a PDU 10 may optionally have slots 90 in its top cover 23, to permit a measure of heat dissipation from the PDU and/or the inserted power bricks. One skilled in the art will recognize that the bottom and/or sides of a PDU 10 may also or alternately have slots 90.

Each LED power indicator 70 provides a visual indication by a lighted LED that power is being provided to a power brick by a corresponding power brick bay 40. A power indicator 70 may be implemented according to any of a number of well-known designs, e.g., the Lamp Current Monitor circuit available through the Discover Circuits website, where the lamp is replaced by the load of an inserted power brick.

Figure 7:
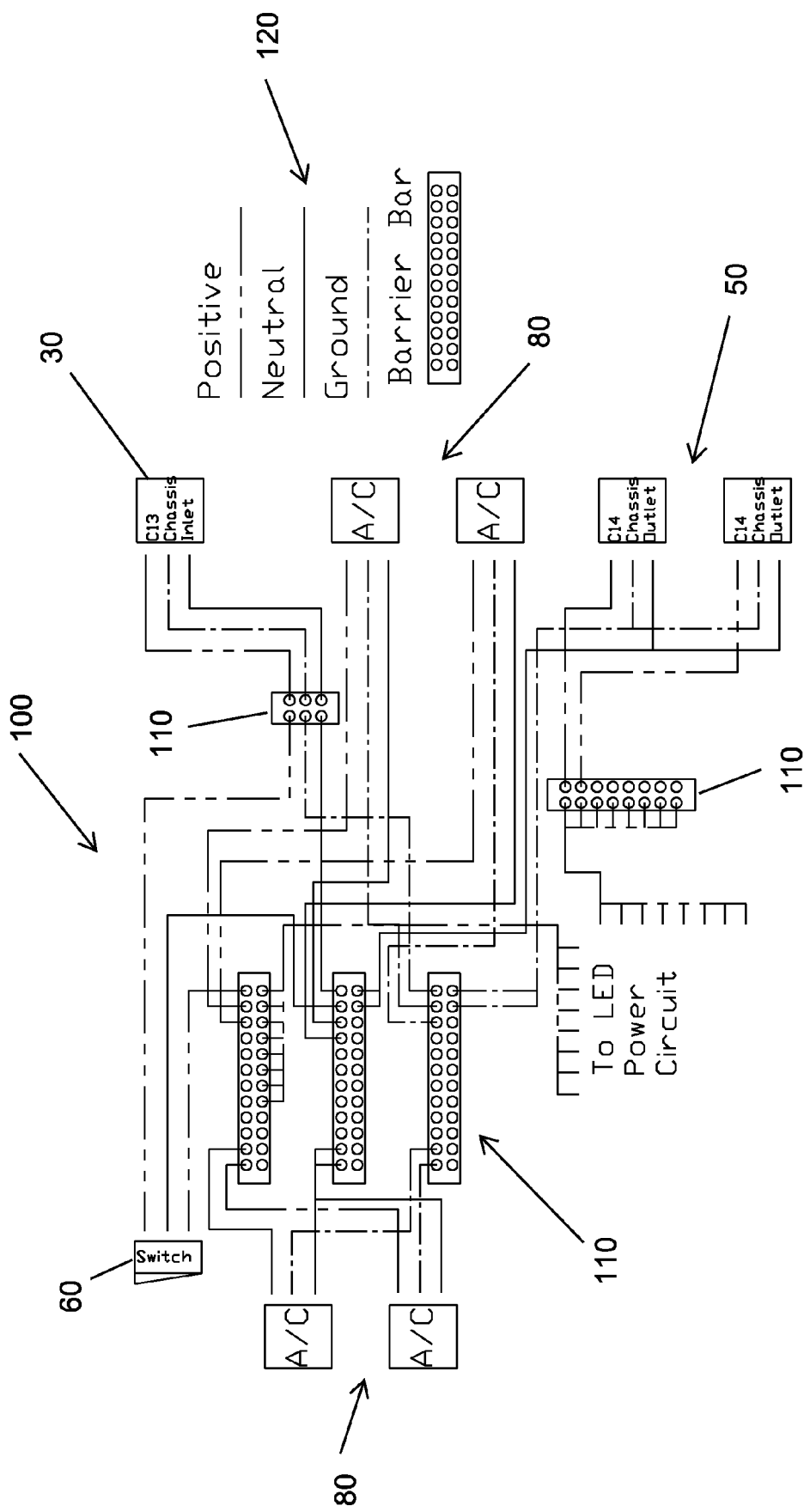
FIG. 7 is an electrical wiring diagram of an embodiment of a power distribution unit (PDU) in accordance with principles of the present invention.
Figure 8:
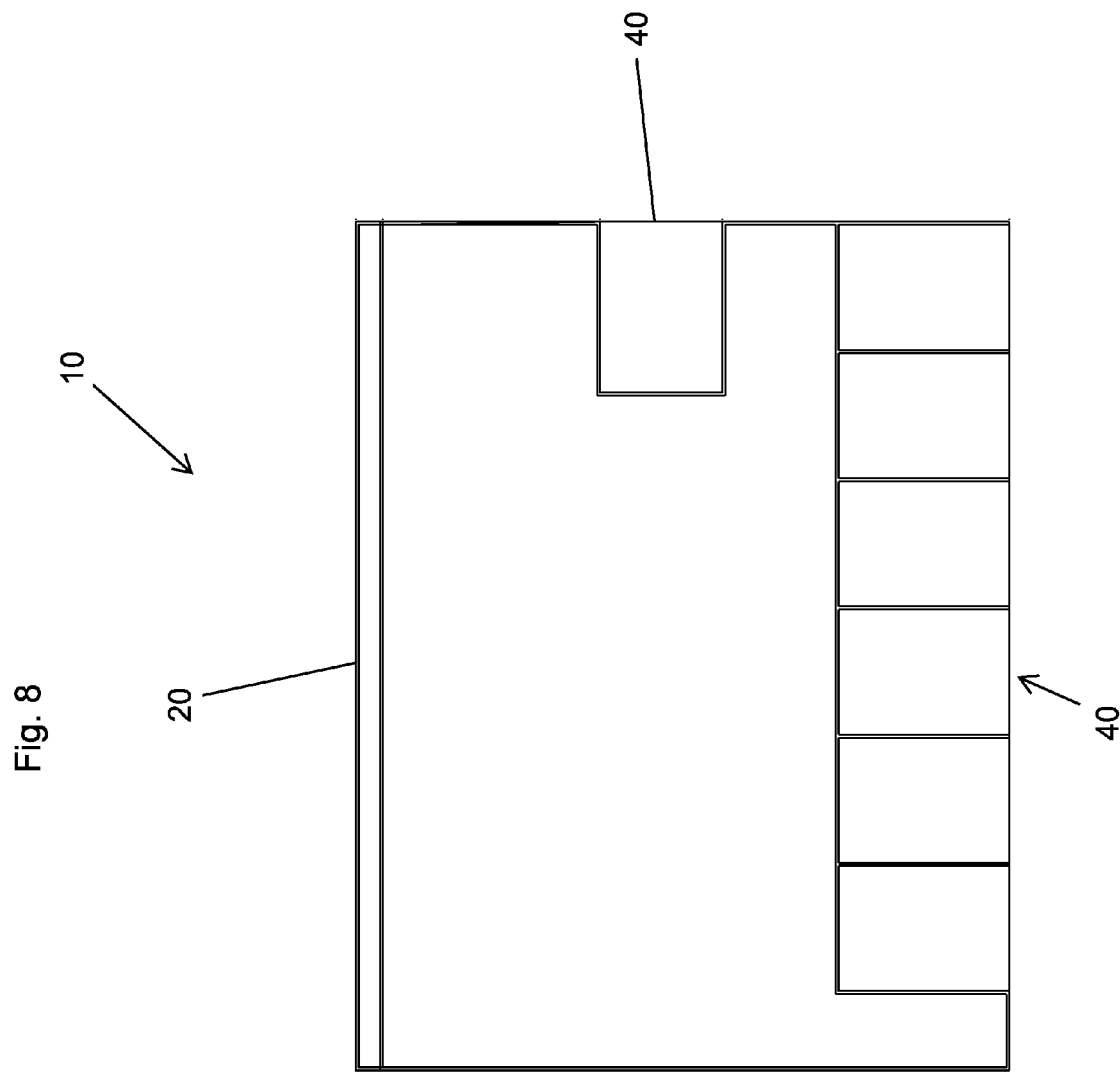
FIGS. 8 and 9 depict a top view and perspective view of an alternate embodiment of a power distribution unit in accordance with principles of the present invention.
Figure 9:
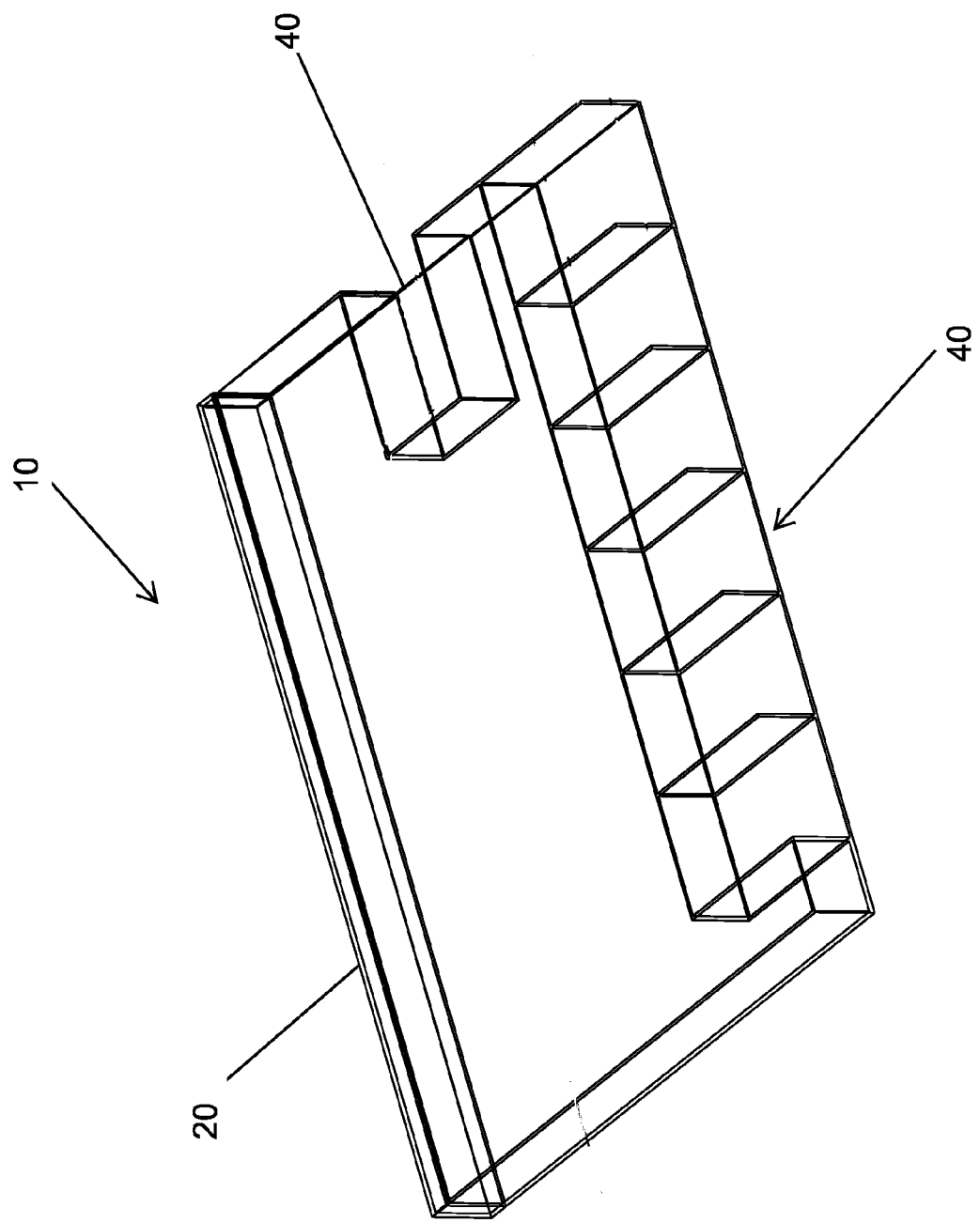

FIG. 7 is an electrical wiring diagram of an embodiment of a power distribution unit (PDU) in accordance with principles of the present invention. As depicted in FIG. 7, electrical wiring 100 is comprised of a wiring power input 30 for receiving power from an external power source, a switch 60 to control the delivery of power to other components of the PDU 10 (e.g., female power adapters 50, LED power indicators 70, and AC power outlets or adapters 80), one or more barrier bars 110 for providing connection points within the electrical wiring 100, and electrical wires 120 to interconnect the various components of the PDU 10.

During operation, a user manually inserts one or more power bricks (not shown) into the one or more power brick bays 40 of the PDU 10. The power connector on a power brick pluggably mates with the female power adapter 50 at the rear wall of a power brick bay 40. Once mated, the PDU 10 provides electrical power to the inserted power brick through the female power adapter 50.

Figure 10:
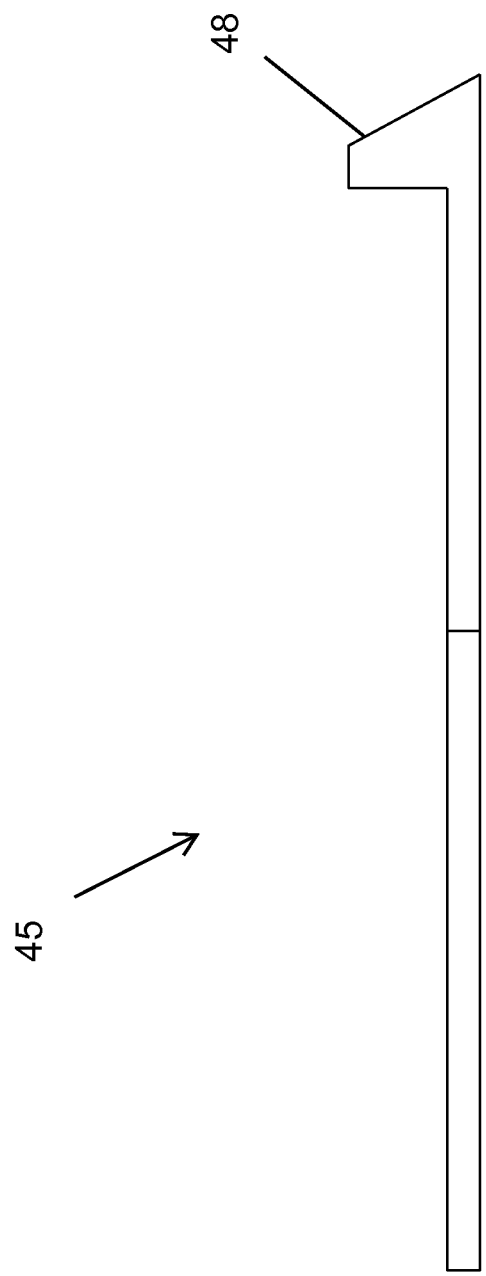
FIG. 10 depicts a latch of an alternate embodiment of a power distribution unit in accordance with principles of the present invention.

An inserted power brick is securely held in place by the walls of a power brick bay 40, thus reducing the likelihood of the power brick being accidentally dislodged. Optionally, a power brick bay 40 may also include a flexible latch 45 as depicted in FIG. 10 to hold a power brick securely in place within the power brick bay 40. FIG. 11 depicts a top view of PDU 10 with latches 45 included in each of eight power brick bays 40. A power brick, when inserted into a power brick bay 40, displaces the catch 48 of a flexible latch 45 until the power brick is fully seated, at which point the catch 48 of flexible latch 45 holds the power brick in place in the power brick bay 40.

The chassis 20 may be comprised of any suitable material or combination of materials, including aluminum, steel and non-metallic materials.

While a particular form and use of the present invention has been described above, the invention is not limited to the specific arrangement of parts or manner of use described.

One skilled in the art understands that modifications to the construction and use of the present system may be made without departing from the scope of the invention.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention. This disclosure is intended to cover any adaptations or variations of the embodiments discussed herein.

What is claimed is:

1. A power distribution device, the device comprising:
   a chassis;
   a power input for receiving power from an external power source;
   a plurality of power brick bays for receiving, and delivering power to, respective power bricks, where each power brick bay includes a power adapter for pluggably mating to a power connector of a power brick thereby providing power to the power brick; and
   electrical wiring for distributing power from the power input to the plurality of power brick bays, wherein the electrical wiring is electrically coupled to the power input and electrically coupled to the power adapter of each of the plurality of power brick bays,
   wherein each power brick bay has a bottom wall, two opposing side walls, and a rear wall, the bottom wall having a first width, each side wall having a second width, wherein the side walls and bottom wall are substantially of an equal length and the bottom wall, side walls and rear wall are arranged in a substantially rectangular configuration,
   wherein the power distribution device does not include a latch for securing a power brick to a power bay, and
   wherein each power brick is securely held in place only by the walls of one of said plurality of power brick bays, without any other securing component.

2. The power distribution device of claim 1, the chassis having two opposing sides, a left side and a right side, wherein the plurality of power brick bays are arranged substantially along a line between the left side and the right side.

3. The power distribution device of claim 2, wherein at least one power brick bay is disposed along a left side or right side of the chassis.

4. The power distribution device of claim 1, wherein the power adapter of each power brick bay is disposed on the rear wall of the power brick bay.

5. The power distribution device of claim 1, wherein the first width is less than the second width, thereby permitting each power brick bay to receive a power brick in a sideways orientation.

6. The power distribution device of claim 1, wherein the first width is greater than the second width, thereby permitting each power brick bay to receive a power brick in a horizontal orientation.

7. The power distribution device of claim 1, wherein at least one power brick bay further has a top wall opposing its bottom wall, the top wall having the second width of the bottom wall and a length substantially equal to the length of the side walls and bottom wall.

8. The power distribution device of claim 2, wherein the plurality of power brick bays are disposed along the rear side of the chassis.

9. The power distribution device of claim 2, wherein the plurality of power brick bays are disposed along the front side of the chassis.

10. The power distribution device of claim 1, wherein at least one of the power adapters provides AC power.

11. The power distribution device of claim 10, wherein the at least one power adapter providing AC power conforms to the IEC 60320 standard.

12. The power distribution device of claim 1, wherein at least one of the power adapters provides DC power.

13. The power distribution device of claim 1, wherein at least one of the power adapters is a female power adapter.

14. The power distribution device of claim 1, further comprising two or more rack mount brackets for mounting the power distribution device to a rack.

15. The power distribution device of claim 14, wherein the rack mount brackets conform to the IEC 60297 standard.

16. The power distribution device of claim 1, further comprising a power switch for controlling the delivery of power from the power input to the power brick bays.

17. The power distribution device of claim 1, further comprising one or more power indicators, each power indicator for providing a visual indication that power is being provided to a power brick by a corresponding power brick bay.

18. A power distribution device, the device comprising:
a chassis;
a power input for receiving power from an external power source;
a plurality of power brick bays for receiving, and delivering power to, respective power bricks, where each power brick bay includes a power adapter for
pluggably mating to a power connector of a power brick thereby providing power to the power brick; and
electrical wiring for distributing power from the power input to the plurality of power brick bays, wherein the electrical wiring is electrically coupled to the power input and electrically coupled to the power adapter of each of the plurality of power brick bays,
wherein each power brick bay consists of a bottom wall, two opposing side walls, and a rear wall, the bottom wall having a first width, each side wall having a second width, wherein the side walls and bottom wall are substantially of an equal length and the bottom wall, side walls and rear wall are arranged in a substantially rectangular configuration,
wherein the power distribution device does not include a latch for securing a power brick to a power bay, and
wherein each power brick is securely held in place only by the walls of one of said plurality of power brick bays, without any other securing component.

19. The power distribution device of claim 18, the chassis having two opposing sides, a left side and a right side, wherein the plurality of power brick bays are arranged substantially along a line between the left side and the right side.

20. The power distribution device of claim 19, wherein at least one power brick bay is disposed along a left side or right side of the chassis.

* * * * *